(12) United States Patent
Haddani et al.

(10) Patent No.: US 8,183,834 B2
(45) Date of Patent: May 22, 2012

(54) CURRENT TO FREQUENCY CONVERSION, APPARATUS AND METHODS

(75) Inventors: Idir Haddani, Montpellier (FR); Bilal Manai, Aix en Provence (FR); Xavier Rabeyrin, Aubagne (FR)

(73) Assignee: Atmel Corporation, San Jose, CA (US)

( * ) Notice: Subject to any disclaimer, the term of this patent is extended or adjusted under 35 U.S.C. 154(b) by 460 days.

(21) Appl. No.: 12/361,145

(22) Filed: Jan. 28, 2009

(65) Prior Publication Data

US 2010/0188049 A1 Jul. 29, 2010

(51) Int. Cl.
*H02J 7/02* (2006.01)
*H02J 7/04* (2006.01)
(52) U.S. Cl. .................... 320/134; 320/149; 320/166
(58) Field of Classification Search .......... 320/124–167
See application file for complete search history.

(56) References Cited

U.S. PATENT DOCUMENTS

| | | | |
|---|---|---|---|
| 4,692,680 A * | 9/1987 | Sherer | 320/103 |
| 5,144,218 A * | 9/1992 | Bosscha | 320/139 |
| 5,349,282 A | 9/1994 | McClure | |
| 5,751,134 A | 5/1998 | Hoerner et al. | |
| 6,154,012 A | 11/2000 | Drori | |
| 7,095,211 B2 | 8/2006 | Denning | |
| 7,592,777 B2 * | 9/2009 | Lu et al. | 320/141 |
| 2007/0222411 A1 * | 9/2007 | Cour | 320/101 |
| 2008/0054847 A1 * | 3/2008 | Elias et al. | 320/130 |

OTHER PUBLICATIONS

"Application Note 746: High-Side Current-Sense Measurement: Circuits and Principles", http://www.maxim-ic.com/appnotes.cfm/an_pk/746, Maxim Integrated Products, (Mar. 2001), 13 pgs.
Casas. R., et al,, "Battery sensing for energy-aware system design", *Computer (IEEE)*, 38(11), (2005), 48-54.
Hamlett, M., et al., "Smart battery analog front end architecture comparison-integrated voltage-to-frequency vs. analog-to-digital converters", *The Sixteenth Annual Battery Conference on Applications and Advances*, (2001), 293-298.
Wang, Chua-Chin, et al., "An All-MOS High-Linearity Voltage-to-Frequency Converter Chip With 520-kHz/V Sensitivity", *IEEE Asia Pacific Conference on Circuits and Systems, 2006. APCCAS 2006.*, (2006), 267-270.

* cited by examiner

*Primary Examiner* — Huy Q Phan
*Assistant Examiner* — Emily Chan
(74) *Attorney, Agent, or Firm* — Fish & Richardson P.C.

(57) ABSTRACT

Electronic apparatus, methods of forming the electronic apparatus, and methods of operating the electronic apparatus include features of current to frequency conversion that may be implemented in a variety of applications. Additional apparatus, systems, and methods are disclosed.

24 Claims, 17 Drawing Sheets

CURRENT TO FREQUENCY CONVERSION, APPARATUS AND METHODS

BACKGROUND

Portable devices operate using power provided by batteries. These batteries in many applications are rechargeable. Use of rechargeable batteries can be accompanied by apparatus in addition to the application to charge the rechargeable batteries. In addition, user-friendly applications typically provide an indication of the capacity of the battery. Providing an indication of the capacity of the battery can be referred to as gas gauging. Gas gauging apparatus and techniques can provide a measure of the remaining capacity of a battery used in an application. With a rise in consumer demand for increased functionality of portable devices, enhancement of battery gas gauging apparatus and techniques is increasing in importance.

BRIEF DESCRIPTION OF THE DRAWINGS

Embodiments of the invention are illustrated by way of example and not limitation in the figures of the accompanying drawings in which.

DETAILED DESCRIPTION

Figure 1:
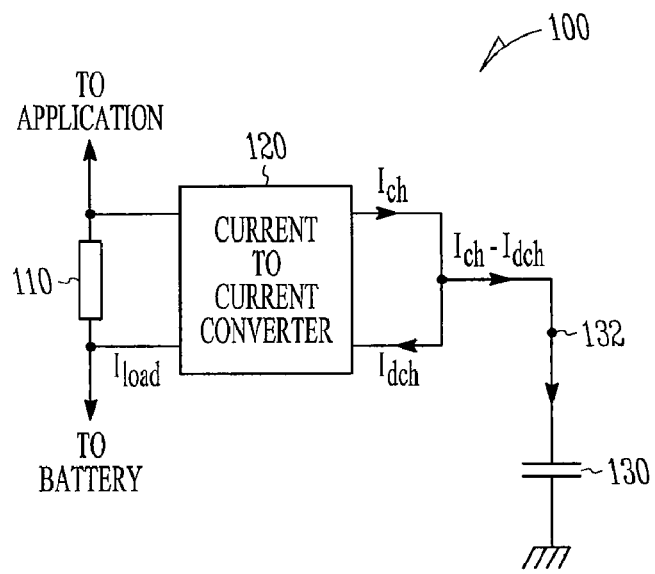
FIG. 1 shows an apparatus having a sensing element, a current-to-current converter, and a capacitor correlated to the charging and discharging of a battery, according to various embodiments.

The following detailed description refers to the accompanying drawings that show, by way of illustration, various embodiments. These embodiments are described in sufficient detail to enable those skilled in the art to practice these and other embodiments. Other embodiments may be utilized, and structural, logical, and electrical changes may be made to these embodiments. Various embodiments are not necessarily mutually exclusive, as some embodiments can be combined with one or more other embodiments to form new embodiments. The following detailed description is, therefore, not to be taken in a limiting sense.

In various embodiments, a current to frequency conversion architecture based on bi-directional current flow to a battery may be used in a variety of electronic applications. A sensing system may be coupled to the battery such that the sensing system is placed in a current path to the battery. With the sensing system providing a small series resistance, current flowing from or into the battery produces a small voltage drop across the sensing system. This voltage drop provides a direct image of the charging or discharging current of the battery depending on the direction of the current flow, which may be represented by the sign or polarity of the current. The sensing system may be a resistor or equivalent sensing element to provide a voltage in response to the current flow. An adjustable resistor or adjustable equivalent sensing element may be used as the sensing system.

This voltage drop and the battery current may be effectively measured and converted into different positive currents: a charge-based current, $I_{ch}$, and a discharge-based current, $I_{dch}$. The charge-based current and the discharge-based current may be provided as a difference current to a node of a single capacitor ($I_{cap}=I_{ch}-I_{dch}$) to convert both charge and discharge currents into frequency. The capacitor, connected to ground opposite the charge/discharge node, acts as a current to frequency converter.

In various embodiments, the capacitor may be maintained between two voltage thresholds, $V_L$ and $V_H$, where $V_H$ is greater than $V_L$, using a circuit designed with respect to the threshold voltages to keep operation of the capacitor in a linear domain. When the battery is charging, the current feeding the capacitor is positive and its voltage grows. When reaching the high voltage threshold, the capacitor may be instantaneously discharged, using the circuit, until the low voltage threshold is reached. If $I_{cap}$ is still positive, the capacitor begins to charge again and the voltage across the capacitor grows again. Each time the voltage reaches $V_H$, the capacitor is discharged. In various embodiments, a charge counter may be incremented each time the capacitor discharges when $V_H$ is reached. If the battery is discharging, the current $I_{cap}$ becomes negative and is drawn from the capacitor. The capacitor voltage decreases. When reaching $V_L$, the capacitor may be instantaneously switched to begin to charge to, using the circuit, until the high voltage threshold is reached. If $I_{cap}$ is still negative, the capacitor begins to discharge again and the voltage decreases again. In various embodiments, a discharge counter may be incremented each time the voltage charges when $V_L$ is reached. In various embodiments, current frequency converter techniques can be used for battery fuel gauging and monitoring current flow into and leaving the battery.

FIG. 1 shows an apparatus 100 having a sensing element 110, a current-to-current converter 120, and a capacitor 130 correlated to the charging and discharging of a battery, according to various embodiments. The battery operatively charges and discharges, sending a current through sensing element 110. Current-to-current converter 120 is coupled to sensing element 110 to provide a current to capacitor 130 correlated to the charging and discharging of the battery. Sensing element 110 may be a resistor or equivalent sensing element to provide a resistance. An adjustable resistor or adjustable equivalent sensing element may be used as sensing element 110. The battery may be used to power an application portion of apparatus 100. When the battery is being recharged, the application portion of apparatus may provide connectivity to a power source external to apparatus 100. During the battery charge, the application portion of apparatus 100 may be powered by the external power source or may be in an off mode. The charging and discharging of the battery in the application may be regulated such that the voltage of the battery, $V_{BAT}$, is maintained between a minimum voltage and a maximum voltage. The minimum and maximum battery voltage may be correlated to a voltage rating of the battery for a given application.

Current-to-current converter 120 may be arranged to provide current $I_{ch}$ correlated to the battery charging through sensing element 110 and to provide current $I_{dch}$ correlated to the battery discharging through sensing element 110. Current-to-current converter 120 may be structured such that the $I_{load}$, which is bidirectional due to charging and discharging, may be converted to $I_{ch}$ and $I_{dch}$ as positive currents exclusive of each other. At node 132 of capacitor 130, a difference current is provided that is the difference between the exclusive currents $I_{ch}$ and $I_{dch}$. Provided with the difference current of the two exclusive currents, capacitor 130 acts as an integrating capacitor. In charging mode, capacitor 130 is fed by capacitor current, $I_{cap}$, where $I_{cap}=I_{ch}-I_{dch}=I_{ch}-0>0$, and capacitor 130 charges. In discharging mode, capacitor 130 is fed by $I_{cap}=I_{ch}-I_{dch}=0-I_{dch}=-I_{dch}<0$, and capacitor 130 discharges.

Figure 2:
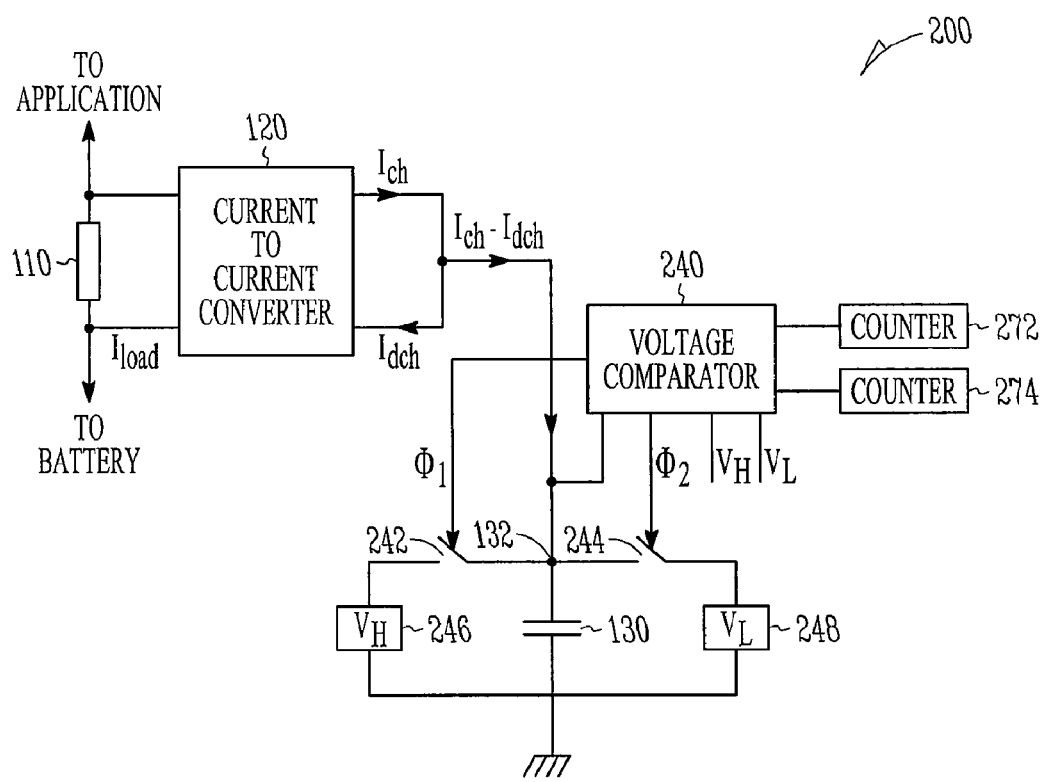
FIG. 2 depicts an apparatus having a sensing element, a current-to-current converter, and a capacitor configured as in FIG. 1 and including a voltage comparator to provide a voltage window for operation of the capacitor, according to various embodiments.

FIG. 2 shows an apparatus 200 having sensing element 110, current-to-current converter 120 coupled to sensing element 110, and capacitor 130 configured as in FIG. 1 with capacitor 130 coupled to a voltage comparator 240 to provide a voltage window for operation of capacitor 130. Sensing element 110 may be a resistor or equivalent sensing element to provide a resistance. An adjustable resistor or adjustable equivalent sensing element may be used as sensing element 110. The battery may be used to power an application portion of apparatus 200. When the battery is being recharged, the application portion of apparatus may provide connectivity to a power source external to apparatus 200. During the battery charge, the application portion of apparatus 200 may be powered by the external power source or may be in an off mode. Further, sensing element 110, current-to-current converter 120, sensing element 110, and capacitor 130 may operate as discussed above with respect to FIG. 1.

Voltage comparator 240 provides a voltage window of operation of capacitor 130 that insures the capacitor voltage, $V_{CAP}$, of capacitor 130 is confined in a predetermined range corresponding to a selected domain of linearity for operation of capacitor 130. This range may be set in the voltage area or interval ($V_L$, $V_H$) with $V_H$ higher than $V_L$. When the capacitor 130 charges and reaches the $V_H$ threshold, the current is reversed and capacitor 130 discharges. Current is drawn from the capacitor 130 when $V_{CAP}$ reaches $V_H$ and a switch 242 is closed. Capacitor 130 is then discharged until its voltage reaches $V_L$ threshold, where switch 244 opened and current flows into capacitor 130 and it charges again. Maintaining $V_{CAP}$ between $V_L$ and $V_H$ may be implemented using a circuit 246 as the $V_H$ control and a circuit 248 as the $V_L$ control. In addition, a count of the charging and discharging can be realized using counters 272 and 274.

Voltage comparator 240 may be arranged to receive the thresholds $V_H$ and $V_L$ from an external source. Alternatively, thresholds $V_H$ and $V_L$ may be generated internally in voltage comparator 240. The thresholds $V_H$ and $V_L$ may be set to values correlated to voltage ranges associated with the battery. When voltage comparator 240 determines that the voltage at capacitor 130 has reached $V_H$, a signal $\Phi_1$ may be provided to switch 242. When voltage comparator 240 determines that the voltage at capacitor 130 has reached $V_L$, a signal $\Phi_2$ may be provided to switch 244. The apparatus of FIGS. 1 and 2 may be used to provide a conversion to frequency.

Figure 3:
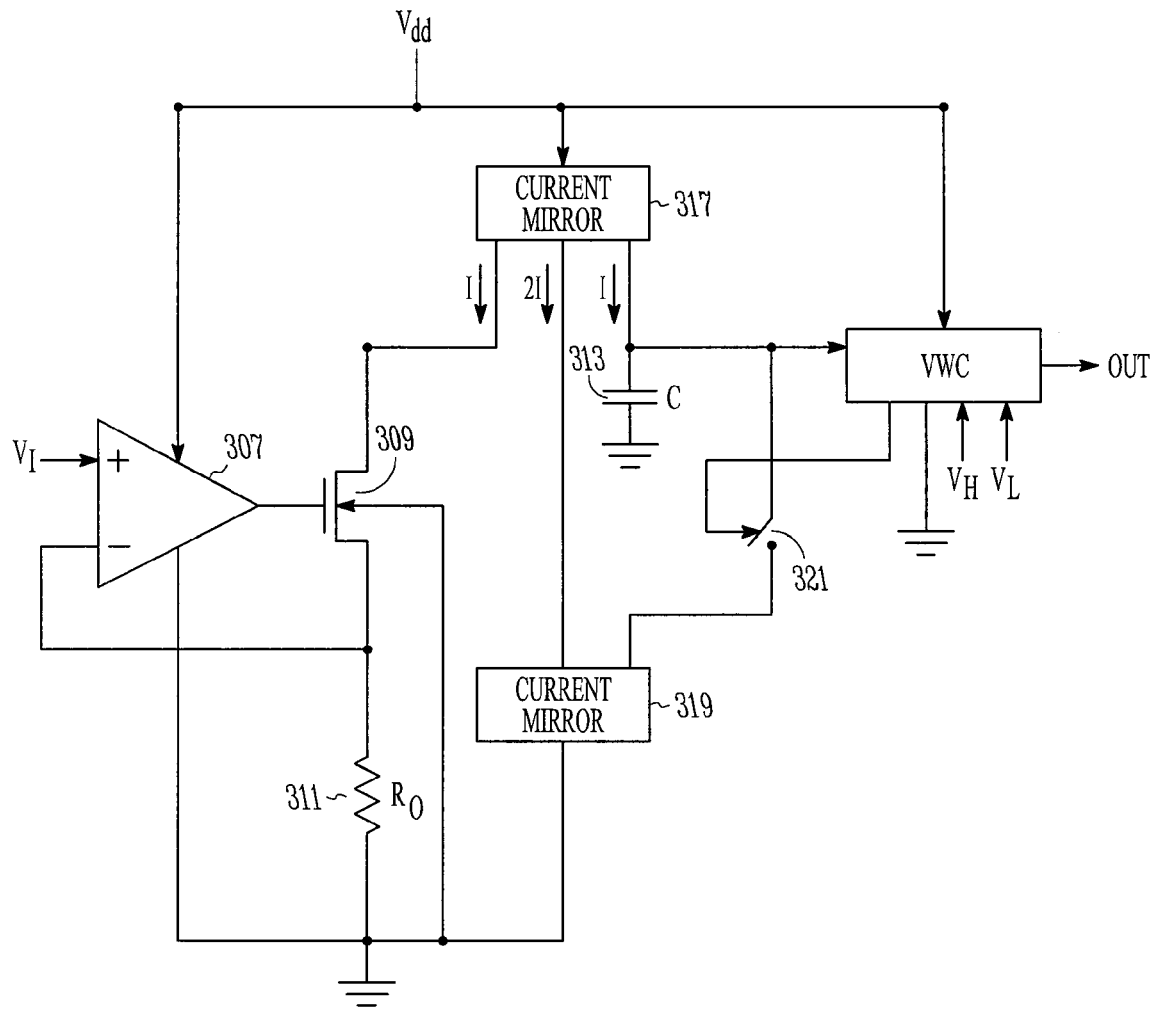
FIG. 3 depicts a voltage to frequency converter.

Other approaches to providing a conversion to frequency can be provided by a voltage to frequency conversion. A voltage to frequency converter (VFC) is an electronic device that converts a voltage input into an output signal (pulses) whose frequency is proportional to the magnitude of the analog input. FIG. 3 shows a VFC. The input voltage ($V_I$) can be first converted to a current I using a voltage to current converter constituted by an operational amplifier (OpAmp) 307, an n-channel metal oxide semiconductor (NMOS) transistor 309 and a resistor ($R_0$) 311. The converted current is $I=V_I/R_0$. The current can be copied using a current mirror 317 with the copied current brought to a capacitor (C) 313 that can be used as an integrator. When a voltage is applied at the input of the converter, it is converted to a current which charges the capacitor. A voltage window comparator may be used to insure that the voltage of capacitor 313 is confined in a predetermined range corresponding to a selected domain of linearity between $V_L$ and $V_H$, where $V_H$ is higher than $V_L$. When capacitor 313 charges and reaches the $V_H$ threshold, the current is reversed and it discharges. The current inversion can be realized using two current mirrors 317 and 319, where one current mirror 317 provides a current 2I, which is reversed by the other current mirror 319 to −2I. This reversed current is drawn from capacitor 313 using a switch 321 that is closed when the voltage of the capacitor reaches $V_H$. The effective current entering the capacitor is −I=I−2I. Capacitor 313 is then discharged until its voltage reaches the $V_L$ threshold, where the switch is opened and the current entering capacitor 313 is I and capacitor 313 charges again. Switch 321 can be controlled by a voltage window comparator 323 that receives the capacitor voltage and voltages $V_H$ and $V_L$. The relation between the input voltage and the output frequency is given by $f=VI/[2*C*R_0*(V_H-V_L)]$. Output signal frequency is linearly proportional to the input voltage if C, $R_0$, $V_H$, and $V_L$ are known.

Figure 4:
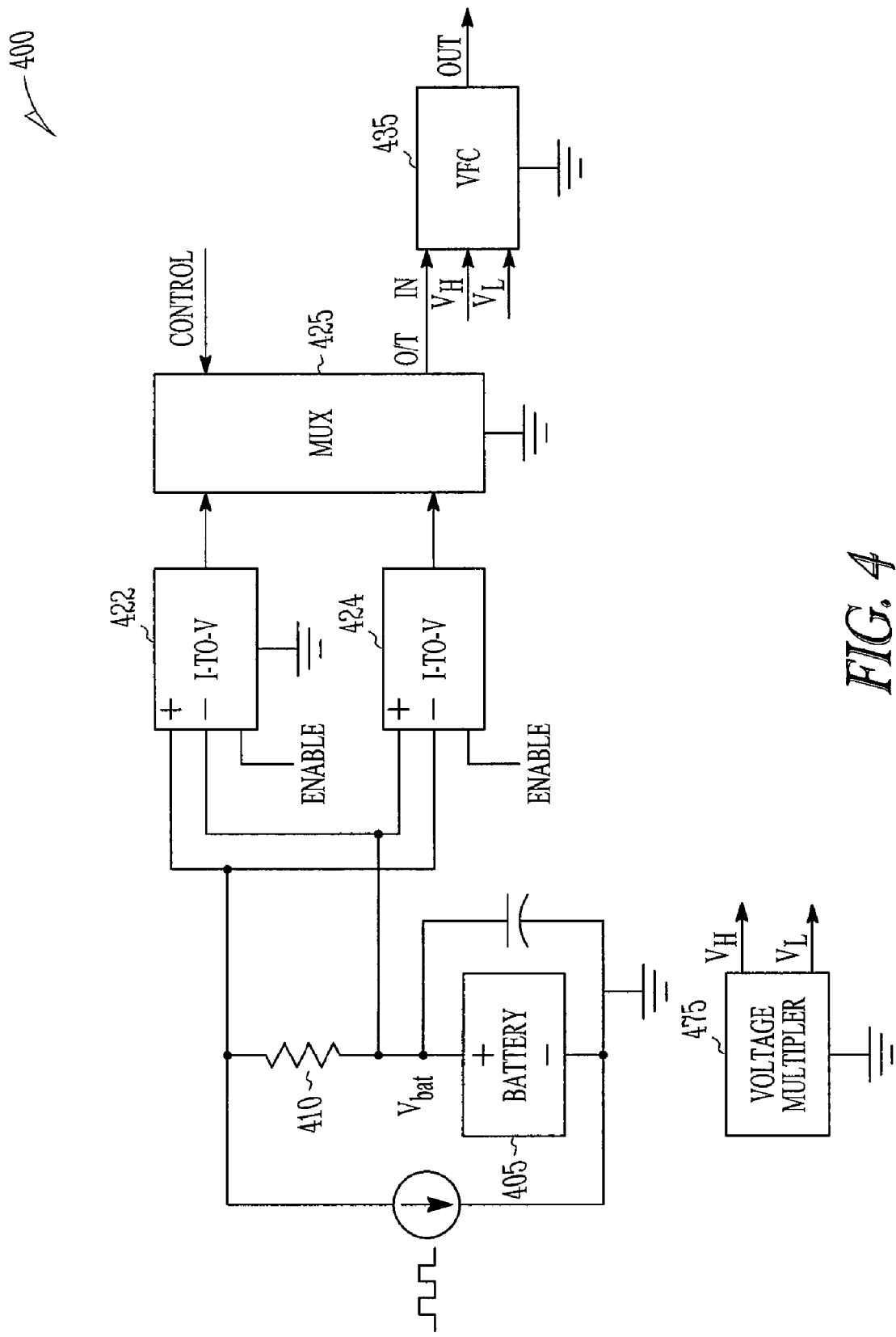
FIG. 4 depicts an apparatus having an architecture for current to frequency conversion, according to various embodiments.

In various embodiments, an architecture can be implemented that provides conversion to frequency from a current conversion. FIG. 4 shows an apparatus 400 having an architecture for current to frequency conversion. The data to convert is not a voltage, as discussed above, but a current. The current can be converted to a voltage in which charge current and discharge current of a battery 405 are distinguished. Two separate voltage drops across a sense resistor ($R_S$) 410, a positive drop voltage and a negative drop voltage, are converted to two positive voltages using two current to voltage converters (I-to-Vs) 422 and 424. These voltages can be provided to an analog multiplexer (mux) 425, which chooses the maximum of the two voltages which is more exactly the non-null voltage and switches it to an input of VFC 435. VFC 435 may be realized using the VFC of FIG. 3. Analog mux 425 can also provide a 1 bit digital signal representing the direction of the current, which can allow digital processing to interpret the converted signal as charge or discharge current. The architecture of apparatus 400 can use a voltage reference generator 475 to provide VH and VL for a window comparison in VFC 435.

In various applications, architectures for a current to frequency converter, such as that of FIG. 4 incorporating FIG. 3, can be used in gas gauging using a coulomb counting method. In gas gauging, the associated data is not current but accumulated current or charges. This can be directly provided by an architecture for a current to frequency converter. Using capacitor 313, associated with the charging and discharging of battery 405, as an integrator, the integrates its current with the result being its voltage U(t): I(t)=C*(dU/dt)=>U(t)=1/C*∫I(t)dt. With the capacitor voltage maintained between the two thresholds $V_H$ and $V_L$, the result is given as ∫I=C*($V_H-V_L$), where I is the current allowing the capacitor to charge from $V_L$ to $V_H$. Further, for a voltage interval, the charge on the capacitor is related to the voltage by Q=C*U. Thus, each time the capacitor is charged from $V_L$ to $V_H$ or discharged from $V_H$ to $V_L$, charge passes to the series resistance 410, the quantity of charge being K*C*($V_H-V_L$). K is the factor of conversion from the load current to the battery to the current flowing to the capacitor. The opening and closing of switch 321 can be correlated to a control signal of 0 and 1. Each time the signal control of switch 321 changes from 0 to 1 or from 1 to 0, a counter can be incremented, which gives the accumulated current passing through sense resistor 313. The analog multiplexer 425 allows counting the accumulated current as a charge current or a discharge current.

Figure 5:
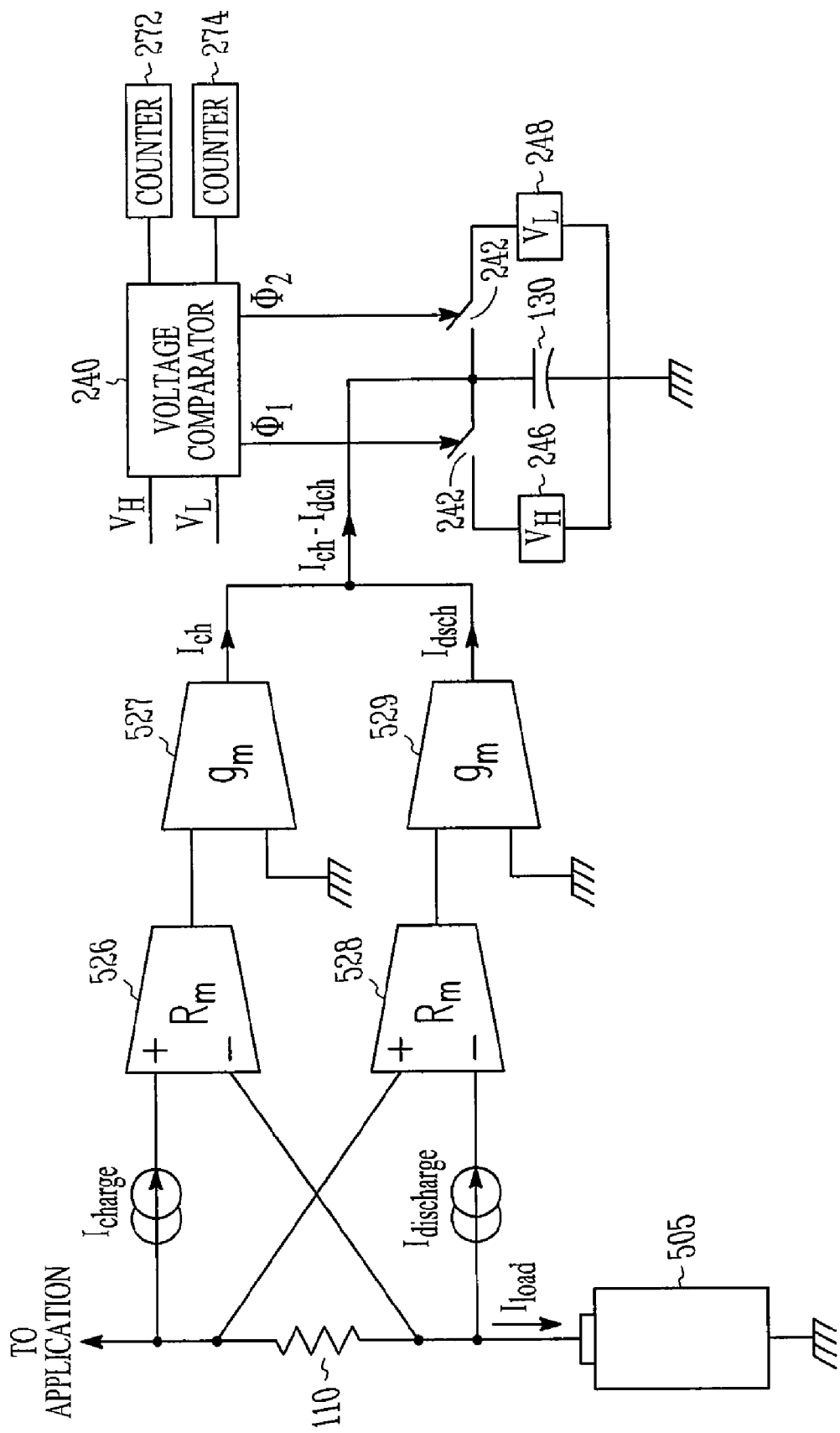
FIG. 5 shows a block diagram of an apparatus that converts a bidirectional current, associated with charging and discharging a battery, to two currents to provide the two currents to a single capacitor, according to various embodiments.

In various embodiments that include gas gauging, a bidirectional current to frequency converter can be implemented. Such a converter may be designed to use a single integrating capacitor without multiplexing charge and discharge currents. FIG. 5 shows a block diagram of an apparatus 500 that converts a bidirectional current, associated with charging and discharging a battery 110, to two currents to provide the currents to a single capacitor. Battery 505 may be used to power an application portion of apparatus 500. When battery 505 is being recharged, the application portion of apparatus 500 may provide connectivity to a power source external to apparatus 500. During the battery charge, the application portion of apparatus 500 may be powered by the external power source or may be in an off mode.

A current, $I_{CHARGE}$, associated with charging battery 505 is provided to a first transresistor 526 coupled to a first node of a sensing element 110. The transresistor 526 is coupled to a first transconductor 527 to generate current $I_{CH}$. Another current, $I_{DISCHARGE}$, associated with discharging battery 505 is provided to a second transresistor 528 coupled to a second node of sensing element 110. The second transresistor 528 is coupled to a second transconductor 529 to generate current $I_{DSCH}$. Transresistors 526 and 528 may have the same transresistance value $R_m$. Transconductors 527 and 529 may have the same transconductance values $g_m$. The two currents, $I_{CH}$ and $I_{DSCH}$, correlated to current through sensing element 110, may be exclusive to each other. The current difference, $I_{CH}-I_{DSCH}$, is provided to capacitor 530.

A voltage comparator 240 provides a voltage window of operation of capacitor 130 that insures the capacitor voltage, $V_{CAP}$, of capacitor 130 is confined in a predetermined range corresponding to a selected domain of linearity for operation of capacitor 130. Maintaining $V_{CAP}$ between $V_L$ and $V_H$ may be implemented using a circuit 246, as the $V_H$ control and a circuit 248 as the $V_L$ control. When voltage comparator 240 determines that the voltage at capacitor 130 has reached $V_H$, a signal $\Phi_1$ may be provided to switch 242. When voltage comparator 240 determines that the voltage at capacitor 130 has reached $V_L$, a signal $\Phi_2$ may be provided to switch 244. The apparatus of FIGS. 1 and 2 may be used to provide a conversion to frequency.

Figure 6:
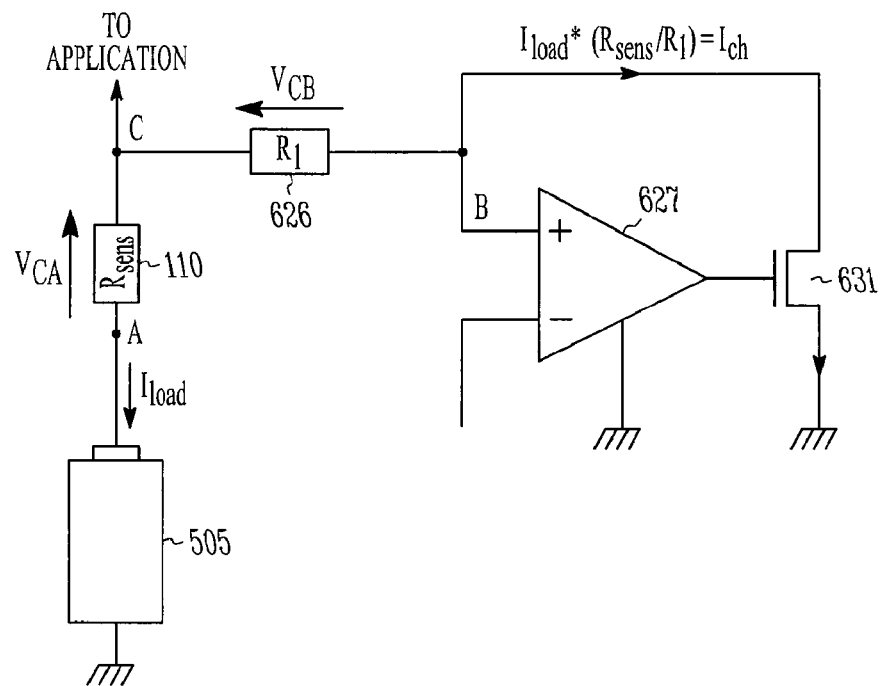
FIG. 6 illustrates a portion of a circuit to convert a bidirectional current of a battery to two positive currents, according to various embodiments.
Figure 7:
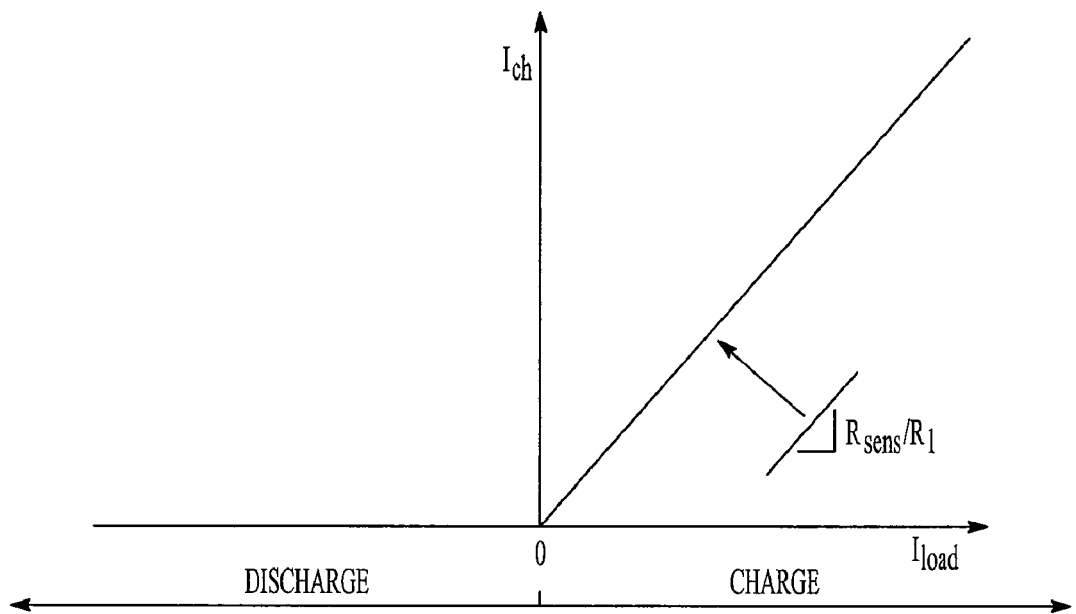
FIG. 7 shows example transfer characteristic of the current-to-current converter illustrated in FIG. 6, according to various embodiments.

FIG. 6 illustrates a portion of a circuit to convert a bidirectional current of a battery to two positive currents. The bidirectional current is current entering and leaving a battery that provides a load current ($I_{load}$) that crosses a sense element 110. When battery 505 charges, copying of the voltage at point A to point B is provided by OpAmp 627 by controlling the current passed by transistor 631. The voltage drop, $V_{CB}$, across transresistor 626 having resistance of $R_1$ is then the same as the voltage drop, $V_{CA}$, across sense element 110 having a resistance of $R_{SENS}$. The current crossing transresistor 626 is then $I=V_{CB}/R_1=V_{CA}/R_1=(R_{SENS}*I_{LOAD})/R_1=I_{CH}$. Feedback is provided to the non-inverting input of the OpAmp 627 due to the NMOS transistor 631, which acts as an inverting stage for OpAmp 627. When the battery discharges, the output of OpAmp 627 is clamped to ground and NMOS transistor 631 is off. The transfer characteristic of this current-to-current converter illustrated in FIG. 6 is shown in FIG. 7.

Figure 8:
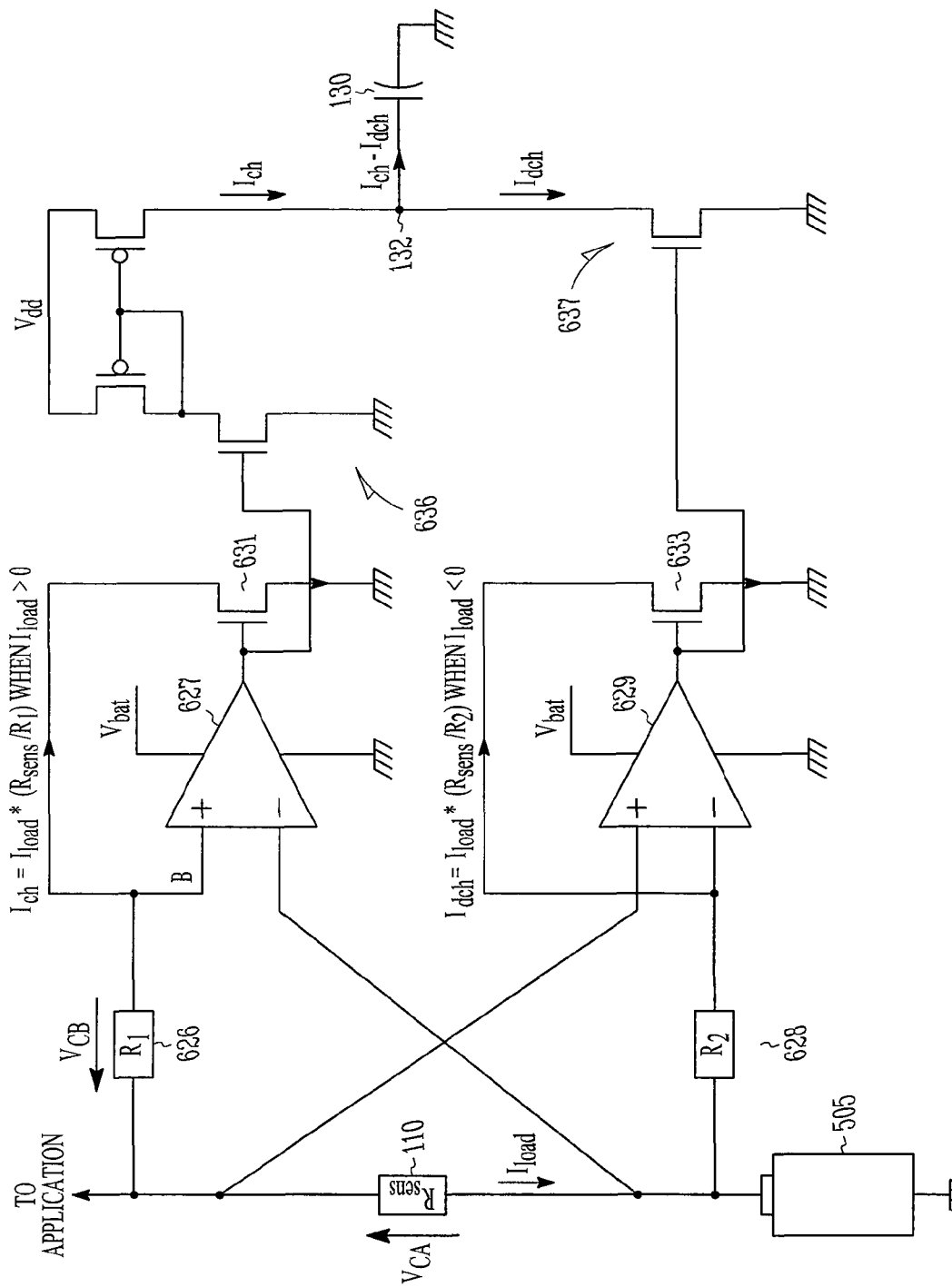
FIG. 8 shows the circuit of FIG. 6 augmented to implement a bidirectional current-to-current converter, according to various embodiments.
Figure 9:
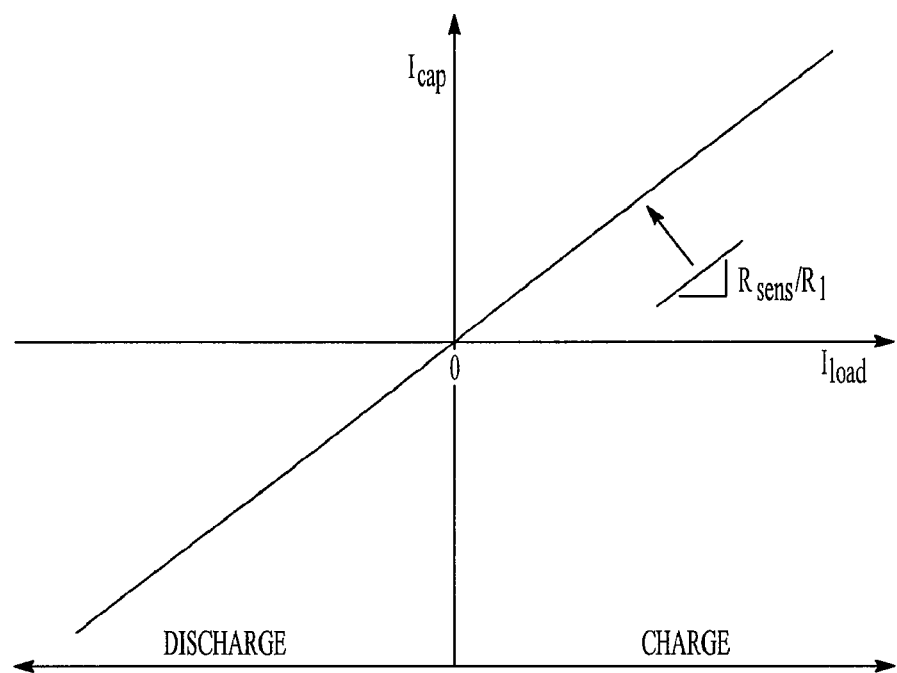
FIG. 9 demonstrates that the capacitor current is a direct image of the load current to the battery of FIG. 8, according to various embodiments.

FIG. 8 shows the circuit of FIG. 6 augmented to implement a bidirectional current-to-current converter. The circuit is augmented with a second OpAmp to provide a second current correlated to discharge currents. The current crossing transresistor 628 is $I=-I_{LOAD}*(R_{SENS}/R_2)=I_{DCH}$, when $I_{LOAD}<0$. Feedback is provided to the non-inverting input of the OpAmp 629 due to NMOS transistor 633. When battery 505 discharges, the output of OpAmp 629 is clamped to ground and NMOS transistor 633 is off. The currents, $I_{CH}$ and $I_{DCH}$, are exclusive in that one is zero while the other one is non-zero based on the alternating on-off states of transistors 631 and 633. When transistor 631 is on, transistor 633 is off and when transistor 633 is on, transistor 631 is off. The negative $I_{LOAD}$ of the discharging of battery 505 is provided as $I_{DCH}$ that is a positive current. The currents crossing transistors 631 and 633 are copied by current mirrors 636 and 637. The copied currents are provided to node 132 and subtracted. The result ($I_{CH}-I_{DCH}=I_{CAP}$) is a bidirectional current to the capacitor 130. $I_{CAP}$ is then a direct image of $I_{LOAD}$ (with $R_1=R_2$), as shown in FIG. 9.

Figure 10:
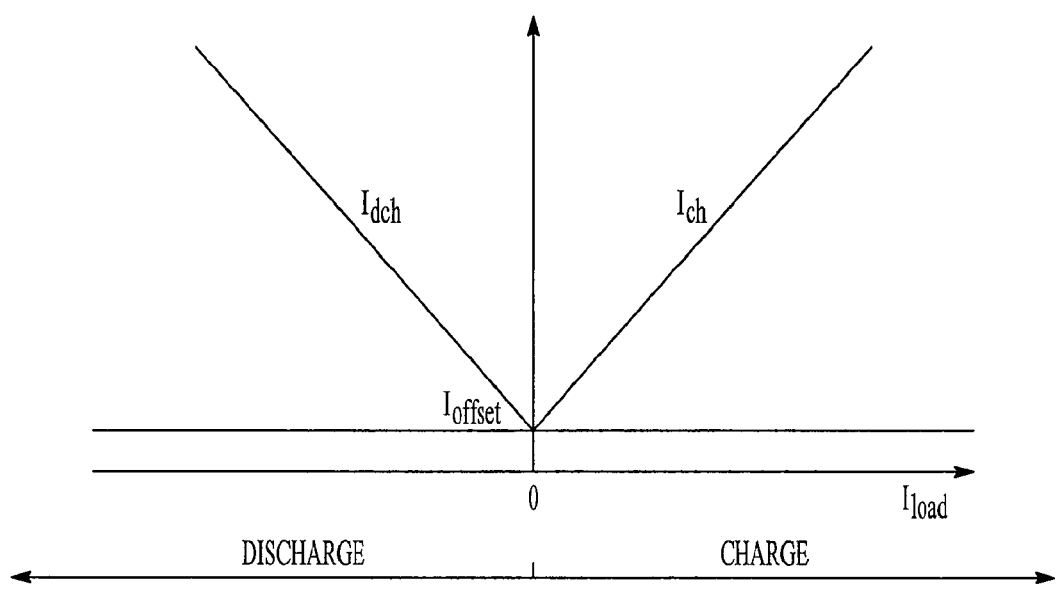
FIG. 10 illustrates an example transfer characteristic for current conversion with a current offset, according to various embodiments.

The transistors constituting the different current mirrors used to copy the currents to node 132 of capacitor 130 may operate in a high inversion domain to provide an accurate copy of the currents. For low currents, operation of the current mirrors may be enhanced over increasing channel width in the transistors by adding an offset to the current-to-current converters. In such embodiment, the current mirrors then copy a minimum saturation current to capacitor 130. The offset present on both $I_{CH}$ and $I_{DCH}$ is canceled in $I_{CAP}$, where $I_{CAP}=(I_{CH}+I_{OFFSET})-(I_{DCH}+I_{OFFSET})=I_{CH}-I_{DCH}$. This cancellation may be realized by adding the same offset to the two channels. The current offset can be realized by adding a variable voltage offset at the inverting input OpAmps 627 and 629. However, in such an offset configuration, both channels consume current even if the mode in which the channel is not used. The transfer characteristic for a current conversion with current offset is illustrated in FIG. 10.

Figure 11:
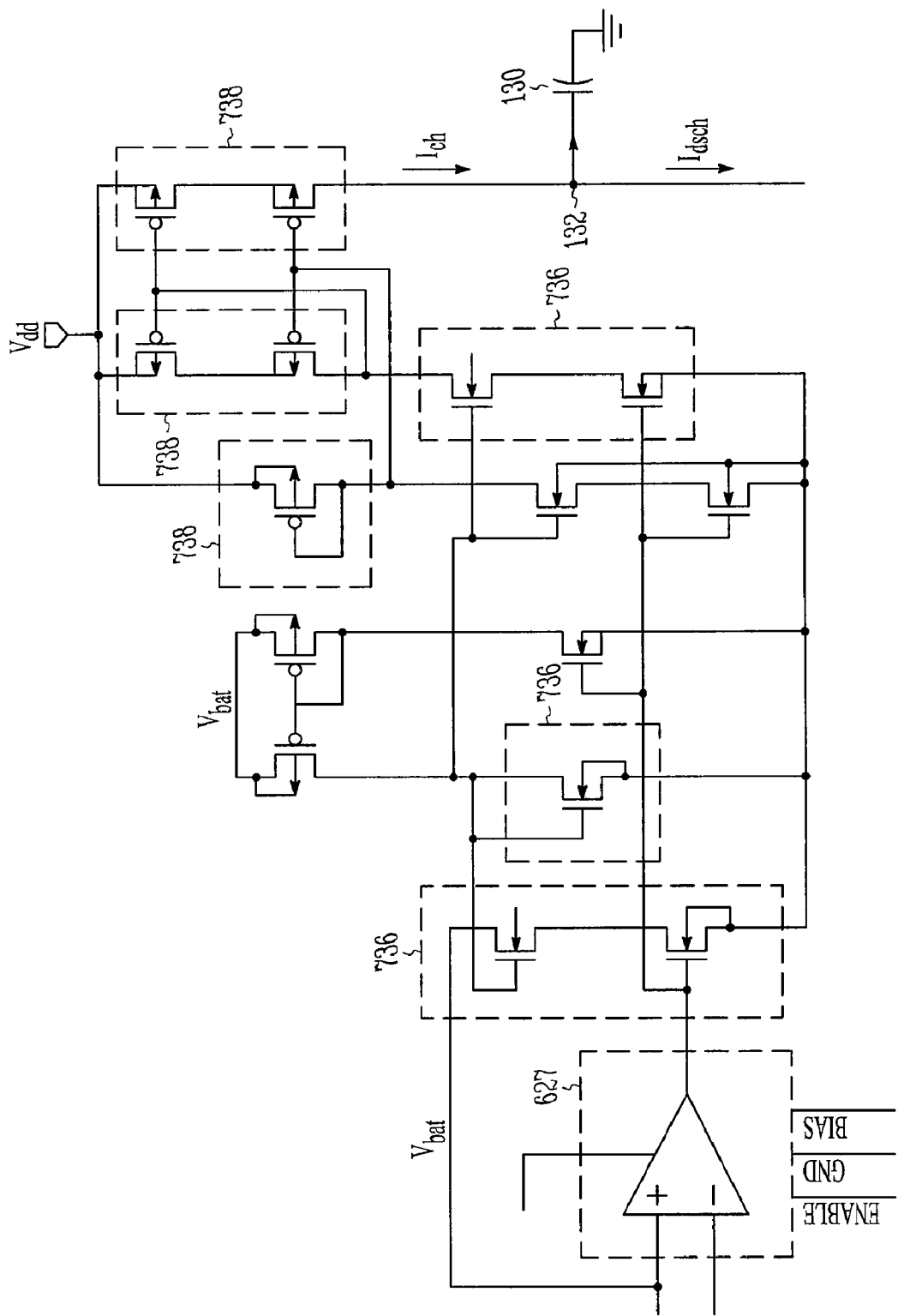
FIG. 11 shows an arrangement of current mirrors that can be implemented to copy current from an operational amplifier to a node of a capacitor shown in FIG. 8, according to various embodiments.

FIG. 11 shows an embodiment of an arrangement of current mirrors that can be implemented to copy current from OpAmp 627 to node 132 of capacitor 130 of FIG. 8. In various embodiments, cascode mirror arrangement is used in the charge channel, where current is copied and inversed. The current in the charge channel is copied by a NMOS high voltage mirror from $V_{BAT}$ to $V_{dd}$ and it is copied by a PMOS low voltage mirror and provided to capacitor. A cascode mirror can avoid inaccuracies to providing a good copy associated with a simple mirror that may also have an accumulated excessive error even with a reduced channel modulation factor. However, a simple cascode may not be best for the NMOS mirror because the current is copied from a variable high voltage (battery voltage between 2.4 V and 4.2 V) to a stabilized low voltage ($V_{dd}$=voltage, $V_{LDO}$, of an LDO lower than 2.4V). In addition, such a mirror may have high minimum input and output voltages ($2V_{ds}$, where $V_{ds}$ is the voltage between transistor drain and source) that may not be desired. In various embodiments, a large output swing cascode current mirror 736 can be implemented for the NMOS mirror, since a large output swing cascode current mirror has a low minimum output voltage ($2\ V_{ds}$), which can keep all transistors in high inversion field in all temperature and process conditions. The same approach may be implemented for the PMOS mirror 738, because of its low minimum input voltage ($V_t+V_{ds}$, where $V_t$ is the transistor threshold voltage). PMOS cascode bulks are connected to their sources to reduce the subtraction effect and reduce the mirror minimum input voltage. The working zone available for this mirror is $V_{dd}-V_H$ which may be very low, in which case minimum output voltage may be an important factor.

In the discharge channel, the current may be more sensitive to voltage output because it is directly copied by a high voltage mirror from the battery voltage to the low voltage threshold. A large output swing current mirror may also be implemented for the discharge channel.

Figure 12:
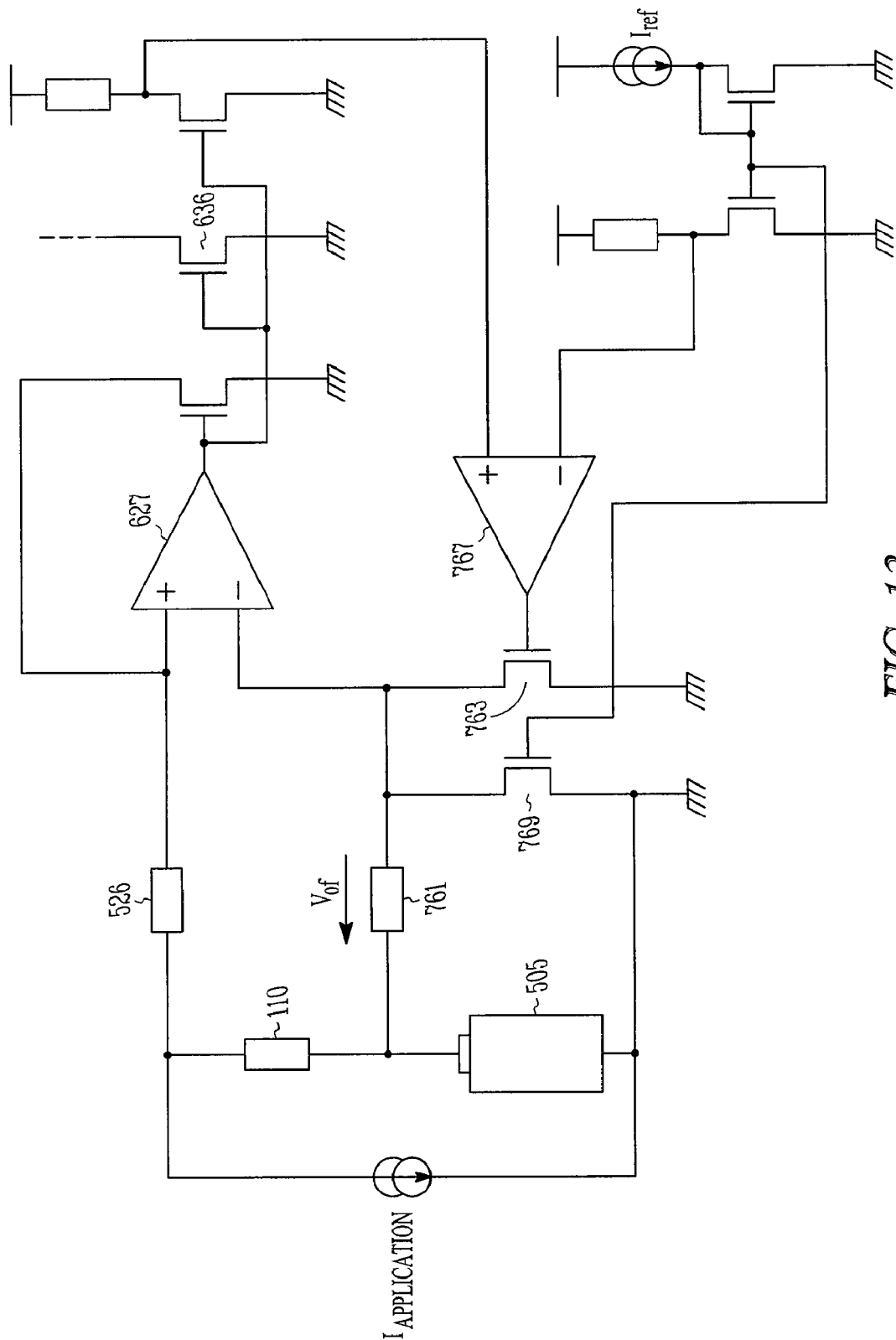
FIG. 12 illustrates an example configuration to provide an offset to an operational amplifier in the apparatus illustrated in FIGS. 6, 8, and 11, according to various embodiments.

FIG. 12 illustrates an example configuration to provide an offset to OpAmp 627 illustrated in FIGS. 6, 8, and 11. OpAmp 627 corresponds to the charge state in various embodiments with battery 505, sense element 110, and transresistor 626. A similar arrangement may be constructed for OpAmp 629 illustrated in FIGS. 6, 8, and 11. In such arrangements, the operational amplifiers and the mirrors are forced from start up, which may be provided by an enable signal, to work all the time, which allows the mirrors to avoid working in the weak inversion region when copying low currents. As shown in the FIG. 12, avoidance of the weak inversion region can be realized by sensing the current at the output of the current mirror 636 and enslaving it to a predetermined value corresponding to the minimal current copied without being in weak inversion in all temperature and process conditions.

The current offset is injected by adding a voltage offset at the inverting input of the OpAmp 627 that constitutes a current to current converter. This voltage offset can be realized by inducing a voltage drop across an offset resistor 761, which forces the OpAmp 627 to see a positive voltage drop. The value of the voltage offset is controlled by the current crossing this resistor. To make this offset vary, the value of this current is controlled, which may be accomplished using transistor 763 that is controlled by a second OpAmp 626 to pass more or less current.

Sensed current is converted to a voltage and provided at the non-inverting input of OpAmp 767. The other input of OpAmp 767 is connected to a voltage corresponding to the predetermined current, $I_{REF}$. OpAmp 767 adjusts its output allowing transistor 763 to pass more or less current, increasing or decreasing the voltage offset and the current offset to meet the predetermined value.

To avoid operating second OpAmp 767 when no variable offset is needed, such as when OpAmp 627 naturally sees a positive drop, a fixed offset is added in parallel using a transistor 769. Transistor 769 passes the current corresponding to the desired offset. Transistor 769 is always active, whereas 763 and OpAmp 767 operate only when battery 505 is in discharge.

The same architecture can be adapted to the discharge channel. The resistors used in the discharge channel and the charge channel are matched together. This matching avoids the offset of the charge channel differing from offset of the discharge channel because of temperature or process variations. Matching of the resistors does not address temperature or process variations that impact the $I_{REF}$ value. However, the design of the circuit provides $I_{REF}$ that may achieve at least a minimum useable reference current in a worst case of process and temperature conditions.

Figure 13:
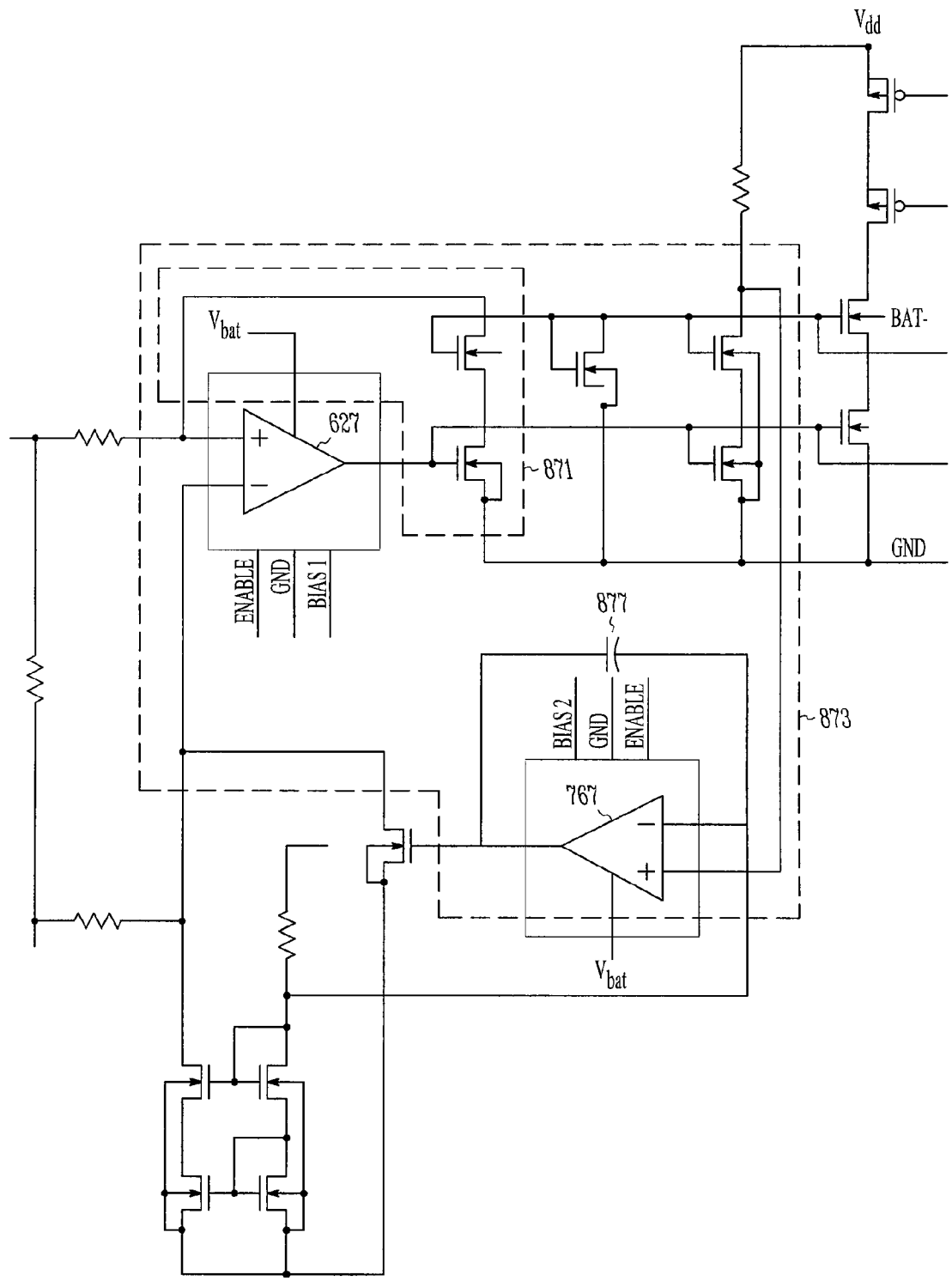
FIG. 13 illustrates an example of the circuit in FIG. 12 augmented with a capacitor to reduce a risk of instability, according to various embodiments.

FIG. 13 illustrates an example of the circuit of FIG. 12 augmented with a capacitor to reduce a risk of instability. OpAmps 627 and 767 have feedbacks to form loops 871 and 873, which may have a risk of instability. A capacitor 877 is added to the circuit to reduce the possibility of a risk of instability. Capacitor 877 is seen in AC mode as a short circuit and as an open circuit in DC mode. A high value capacitor may be used for high value capacitor 877.

Figure 14:
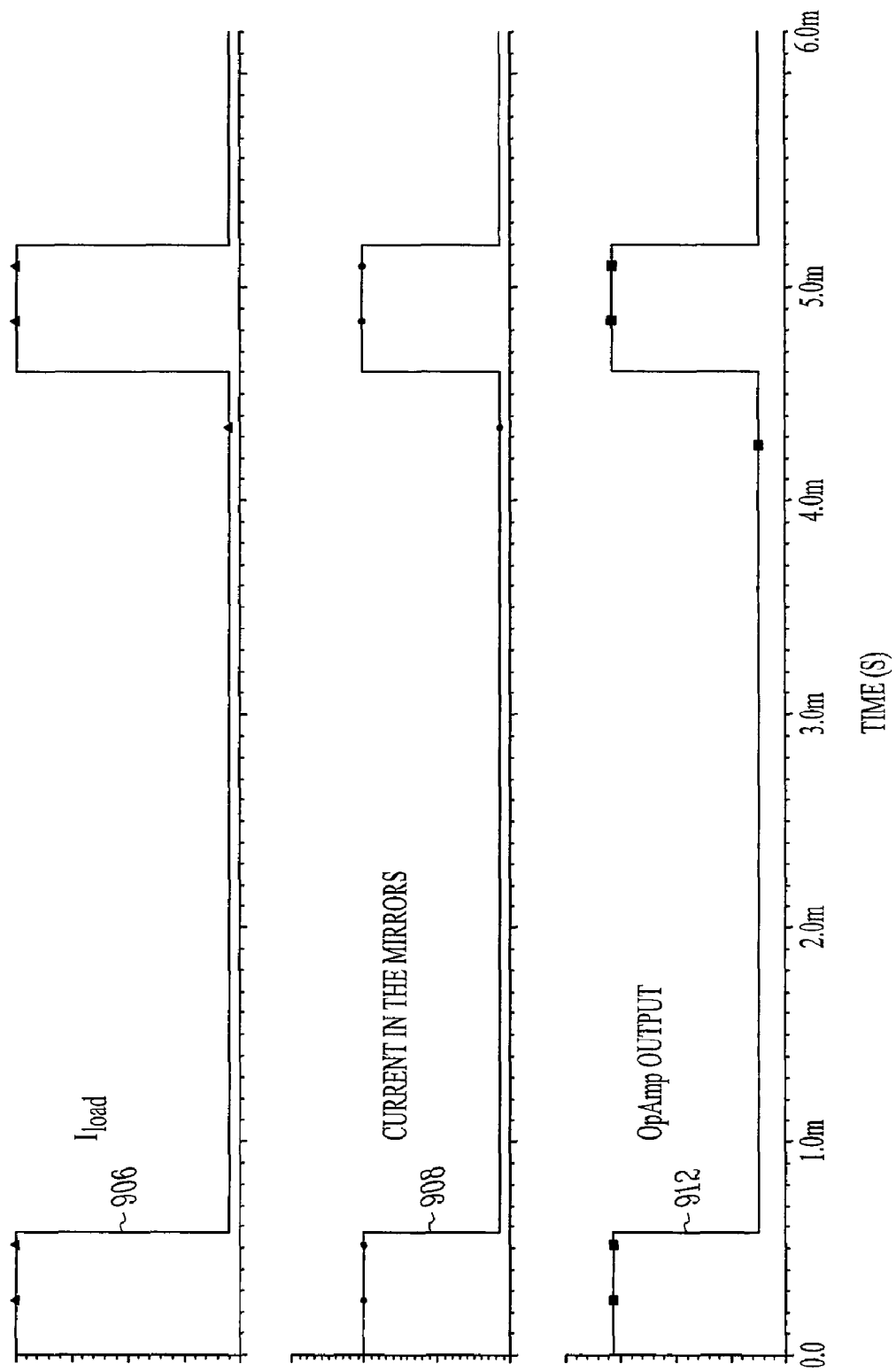
FIG. 14 illustrates a simulation of a transient response to a GSM (Global System for Mobile communications) consumption profile for an arrangement that includes architectural features shown in FIGS. 8, 11, 12, and 13, according to various embodiments.

FIG. 14 illustrates a simulation of a transient response to a GSM (Global System for Mobile communications) consumption profile for an arrangement that includes architectural features of FIGS. 8, 11, 12, and 13. The simulation correspond to typical process and typical temperature conditions. The load current, $I_{LOAD}$, of battery 505 shown in curve 906 is converted to current in mirror 636 as shown curve 908, where output from OpAmp 627 is shown in curve 912. The stability seen in AC simulation is confirmed in transient mode.

Figure 15:
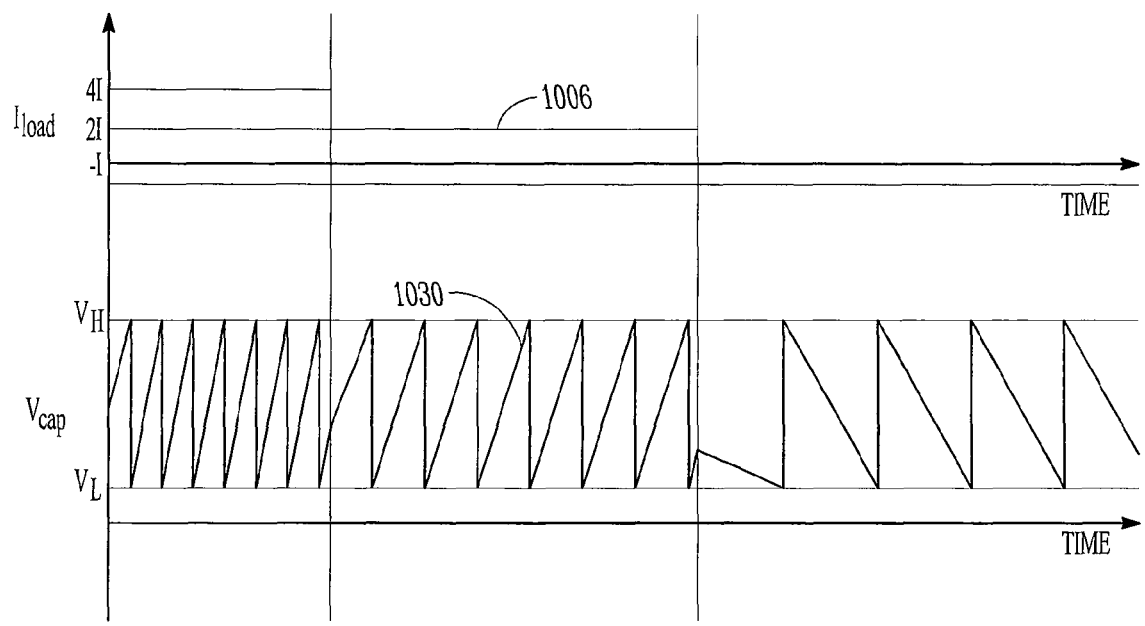
FIG. 15 illustrates voltage behavior of a conversion capacitor versus load current of a battery, according to various embodiments.

FIG. 15 illustrates voltage behavior of a conversion capacitor (curve 1030) versus load current of a battery (curve 1006) in accordance with various embodiments as taught herein. In various embodiments, current to a frequency conversion is performed by charging and discharging capacitor 130 between two thresholds, $V_H$ and $V_L$. When battery 605 is charging, the current feeding capacitor 130 is positive and its voltage is growing. When reaching the high voltage threshold, $V_H$, the capacitor is instantaneously discharged until the low voltage threshold, $V_L$, is reached. If $I_{CAP}=I_{CH}-I_{DCH}$, is still positive, the capacitor begins to charge again and its voltage grows again. Each time the voltage reaches $V_H$, capacitor 130 is discharged. Generating an output pulse each time capacitor 130 is charged to $V_H$ and counting these pulses, using counter 272 of FIGS. 2 and 5 for example, gives an accurate estimation of the charges drawn from battery 605.

If the battery is being discharged, the current $I_{CAP}$ becomes negative and is drawn from capacitor 130. The voltage of capacitor 130 decreases. When reaching $V_L$, capacitor 130 is instantaneously charged until the high voltage threshold, $V_H$, is reached. If $I_{CAP}$ is still negative, capacitor 130 begins to discharge again and the voltage of capacitor 130 decreases again. Each time the voltage reaches $V_L$, capacitor 130 is charged. Generating an output pulse each time the capacitor is discharged to VL and counting these pulses, using counter 274 of FIGS. 2 and 5 for example, gives the end user an accurate estimation of the charges entering the battery. The higher the magnitude of the current to charge battery 605, the lower is the time to charge battery 605 and the frequency of the signal is higher as shown in FIG. 15.

Figure 16:
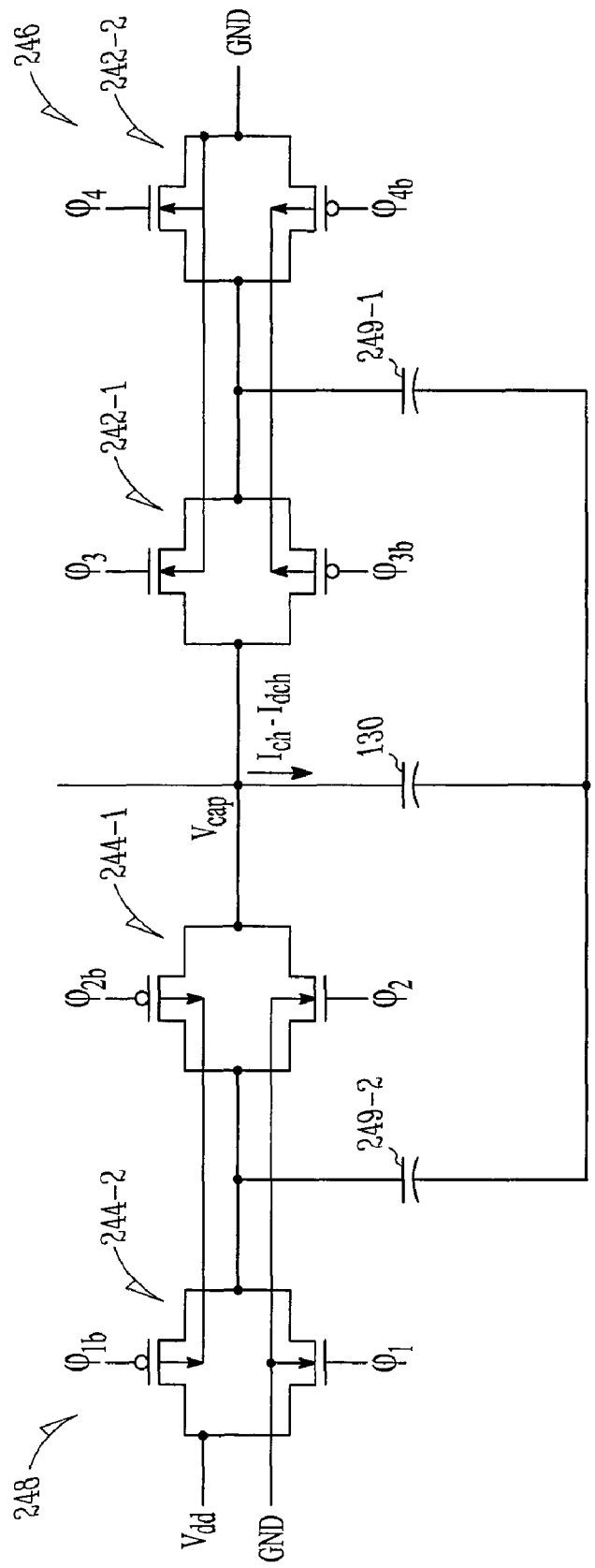
FIG. 16 illustrates features of a circuit that can be implemented to maintain a voltage of a conversion capacitor between two threshold voltages, according to various embodiments.

FIG. 16 illustrates features of a circuit that can be implemented to maintain conversion capacitor 130 between thresholds $V_H$ and $V_L$. The circuit may be used as VH circuit 246 and VL circuit 248 shown in FIGS. 2 and 5. The circuit may be arranged to operate with a second high threshold, $v_h$, whose magnitude is lower than the magnitude of $V_H$ and with a second low threshold, $v_l$, whose magnitude is higher than the magnitude of $V_L$. To operate with integrating capacitor 130, the circuit can includes switches 242-1 and 242-2 coupled to capacitor 249-1 and switches 244-1 and 244-2 coupled to capacitor 249-2. Switch 242-1 can be arranged as two transistors in parallel with one transistor responsive to a signal $\phi_3$ at its gate and the other transistor responsive to a signal $\phi_{3b}$ at its gate. Switch 242-2 can be arranged as two transistors in parallel with one transistor responsive to a signal $\phi_4$ at its gate and the other transistor responsive to a signal $\phi_{4b}$ at its gate. Switch 244-1 can be arranged as two transistors in parallel with one transistor responsive to a signal $\phi_2$ at its gate and the other transistor responsive to a signal $\phi_{2b}$ at its gate. Switch 244-2 can be arranged as two transistors in parallel with one transistor responsive to a signal $\phi_1$ at its gate and the other transistor responsive to a signal $\phi_{1b}$ at its gate.

Figure 17:
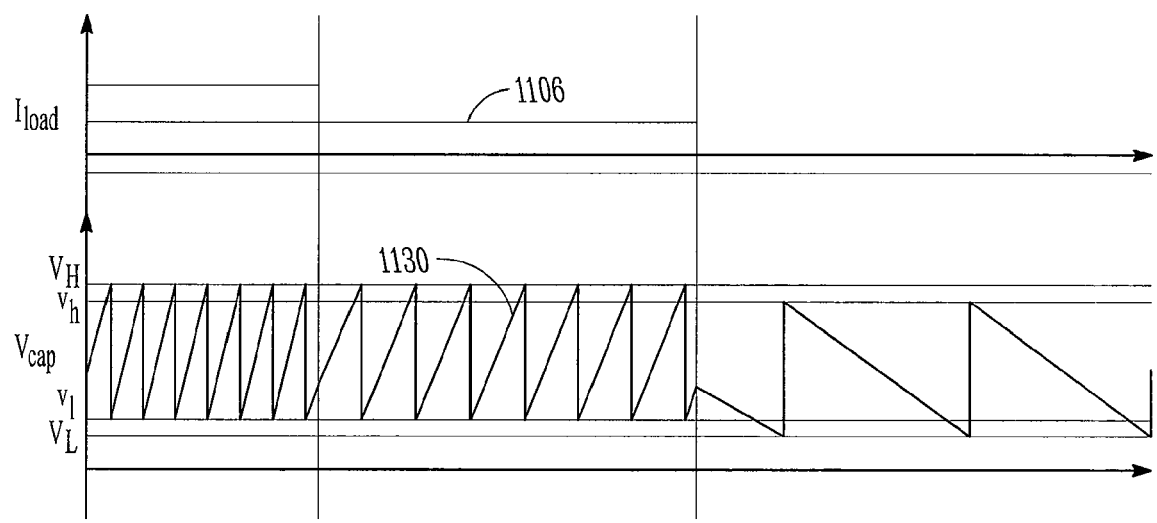
FIG. 17 shows an example relationship of two high thresholds and two low thresholds for maintaining the voltage of an integrating capacitor in a voltage window, with respect to a load current of a battery using switch arrangements shown in FIG. 16, according to various embodiments.

FIG. 17 shows an example relationship of two high thresholds and two low thresholds in curve 1130 for maintaining the voltage of an integrating capacitor in a voltage window, with respect to a load current of a battery using switch arrangements shown in FIG. 16. To charge integrating capacitor 130 from $V_L$ to $v_h$, capacitor 249-2 can be used, where capacitor 249-2 can be charged to $V_{dd}$, using switch 244-2, before being operated to charge capacitor 130. When $V_{CAP}$ reaches the low threshold, the switch 244-2 is opened while 244-1 is closed. When 244-1 closes, the energy stored in 249-2 is partially transferred to capacitor 130 until $V_{CAP}$ reaches a selected voltage level, $V_{249\text{-}2}$, for capacitor 249-2. Capacitor 249-2 can be sized to ensure that the equilibrium voltage $V_{CAP}=V_{249\text{-}2}=v_h$.

In the same manner, to discharge capacitor 130 from $V_H$ to $v_l$, capacitor 249-1 can be used, where capacitor 249-1 can be discharged to ground, using switch 242-2, before being operated to discharge capacitor 130. When capacitor 130 reaches $V_H$, switch 242-2 is opened while 242-1 closed. When 242-1 is closed, the energy stored in capacitor 130 is transferred to capacitor 249-1 until $V_{CAP}$ reaches a selected voltage level, $V_{249\text{-}1}$, for capacitor 249-1. Capacitor 249-1 can be sized to ensure that the equilibrium voltage $V_{CAP}=V_{249\text{-}1}=v_l$.

Figure 18:
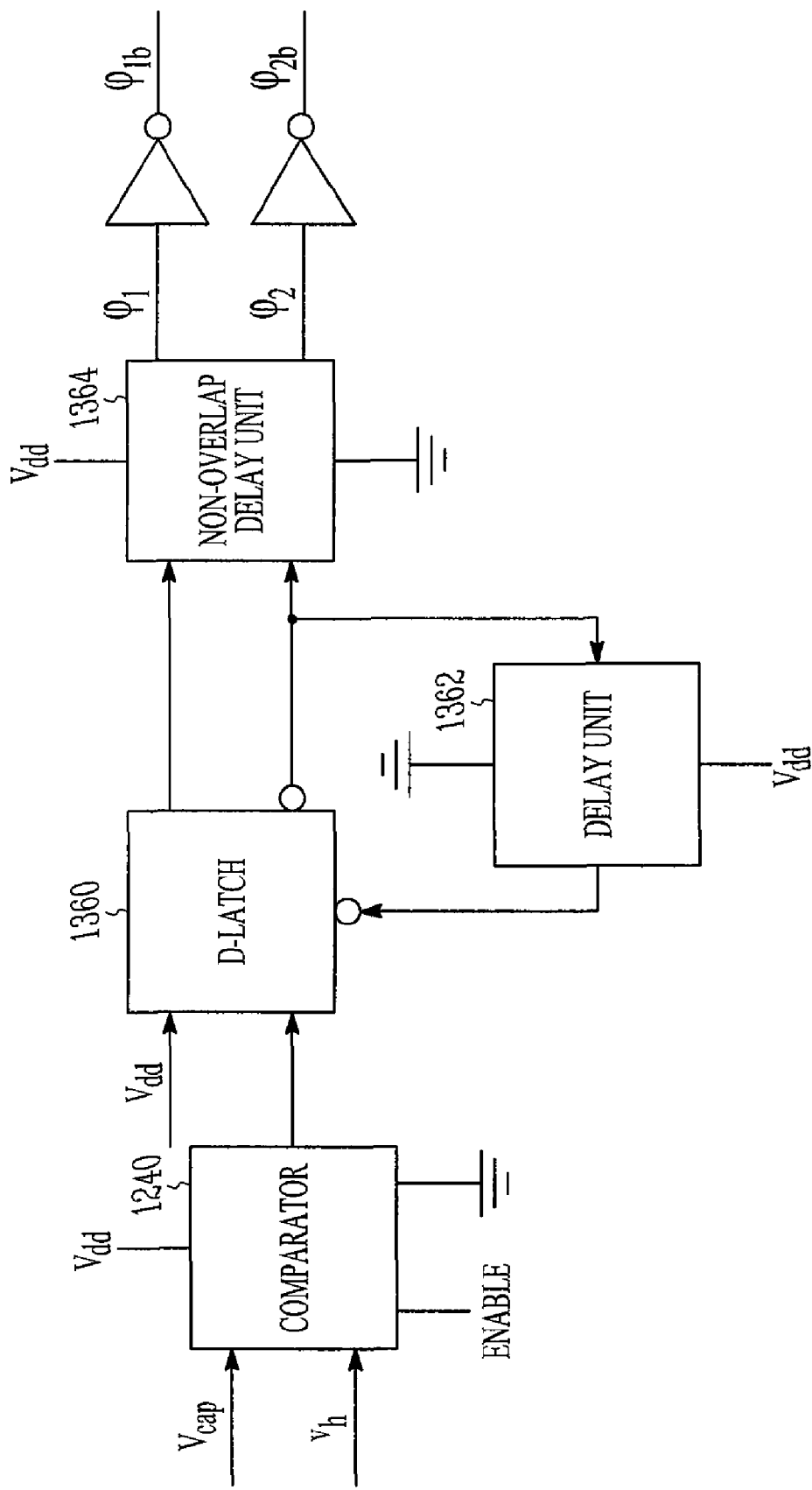
FIG. 18 illustrates an example of an arrangement of a symmetric operational amplifier to operate with the features of the circuit of FIG. 16 to provide control of the maintenance of the voltage of a conversion capacitor in a voltage window, according to various embodiments.

FIG. 18 illustrates an example of an arrangement of symmetric operational amplifier 1240 to operate with the circuit of FIG. 16 to provide control of the maintenance of the voltage of conversion capacitor 130 in a voltage window, identified in FIGS. 2 and 5, where the low and high threshold control signals each include a set of signals as shown in FIG. 16. When a threshold is detected, the output of comparator 1240 is set to a value that is used to close or open a switch until the voltage of capacitor 130 is brought back to the other threshold. The output value of comparator 1240 may be a 1, which may be provided as $V_{dd}$. The 1 signal may be provided to the appropriate switches until voltage of capacitor 130 is charged or discharged depending on the threshold detected. A D-latch 1360 can be used to maintain the 1 signal to the appropriate switch. Output of comparator 1240 can be connected to a clock input of D-latch 1360. The data input of D-latch 1360 is connected to 1 ($V_{dd}$). When the output of comparator 240 is set to 1, D-latch 1360 outputs a data as a 1. The output of D-latch 1360 is kept at a 1 until the next positive event on the clock input, unless the latch is reset. The reset can be executed after a predetermined time delay, corresponding to the time needed to charge from $V_L$ to $V_H$. The predetermined time delay can be realized by a delay unit 1362. A non-overlay delay unit 1364 can be used to provide control signals $\phi_1$ and $\phi_{1b}$ and control signals $\phi_2$, and $\phi_{2b}$ to switches 244-2 and 244-1, respectively. Non-overlap delay unit 1364 can be adapted to ensure that switch 244-2 opens with a small time interval before switch 244-1 closes to avoid charging capacitor 130 directly to $V_{dd}$. A similar arrangement may be used to generate control signals $\phi_3$ and $\phi_{3b}$ and control signals $\phi_4$, and $\phi_{4b}$ to switches 242-1 and 242-2, respectively.

Figure 19:
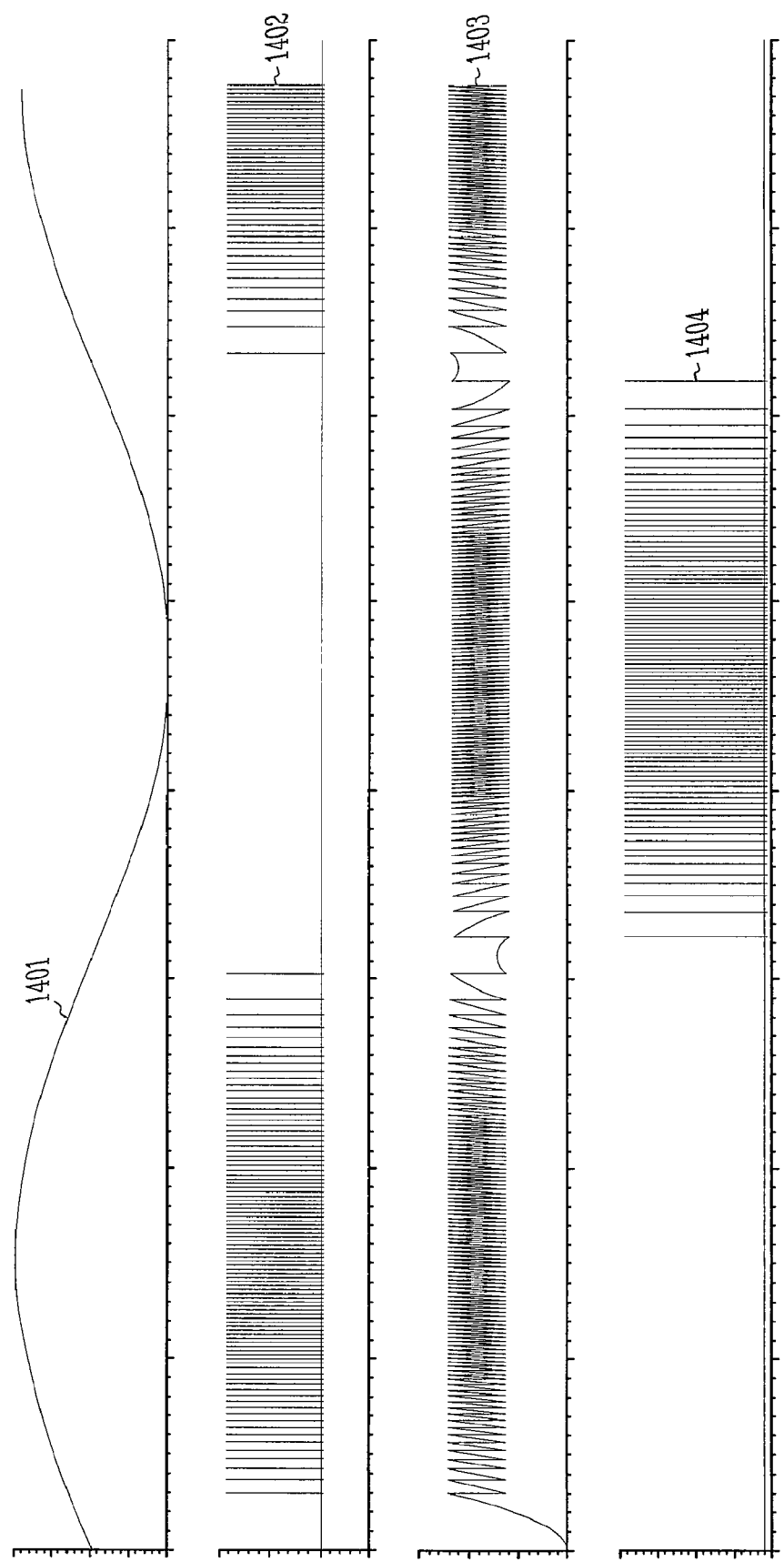
FIG. 19 shows results of a simulation of a sinusoidal current as a battery load current for an architecture including features of FIGS. 8, 11, 12, 13, 16, and 18, corresponding to typical process and typical temperature conditions for a typical GSM current consumption profile, according to various embodiments.

FIG. 19 shows results of a simulation of a sinusoidal current as a battery load current for an architecture including features of FIGS. 8, 11, 12, 13, 16, and 18, corresponding to typical process and typical temperature conditions for a typical GSM current consumption profile. Curve 1401 shows the sinusoidal current centered on 0 combines both charge and discharge steps. FIG. 19 demonstrates that the capacitor voltage frequency is proportional to the load current in curve 1403, where the distinction between charge and discharge current is shown. This distinction is visible on voltage capacitor variation inversion when current crossing 0 in curve 1404. In addition, the charge and discharge outputting pulses are symmetric as shown in curve 1402.

Figure 20:
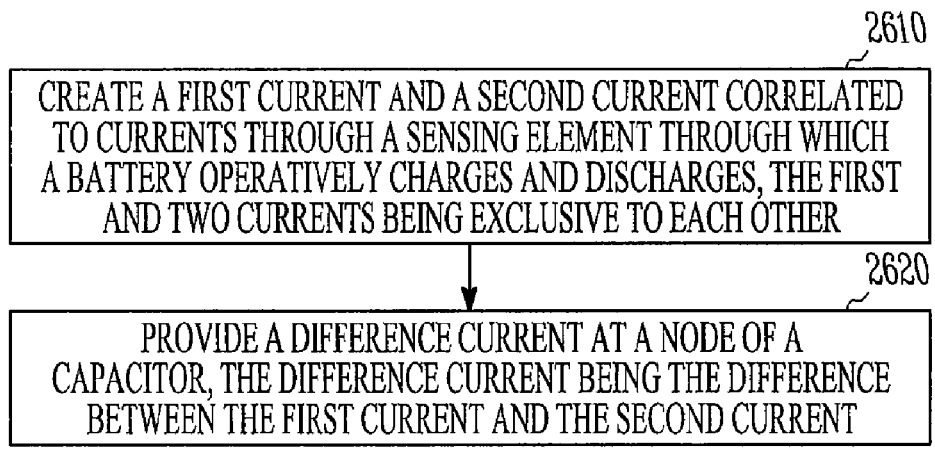
FIG. 20 shows features of a method that can be applied to battery gas gauges using the coulomb counting method, according to various embodiments.

FIG. 20 shows features of a method that can be applied to battery gas gauges using the coulomb counting method. At 2610, a first current and a second current are generated that are correlated to currents through a sensing element through which a battery operatively charges and discharges, the first and two currents being exclusive to each other. Being exclusive means that when the first current is non-zero, the second current is zero and when the second current is non-zero, the first current is zero. The first and second currents may be generated as positive currents.

At 2620, a difference current is provided at a node of a capacitor, where the difference current is the difference between the first current and the second currents. With both the first and the second current generated as positive currents, the difference current is positive for one of the two currents and negative for the other current. The voltage level at the node of the capacitor can be compared to a threshold voltage. The comparison can be arranged with respect to two threshold voltages.

The capacitor can be discharged, which can be initiated when the voltage of the capacitor reaches a first threshold voltage. The discharge of the capacitor can continue until the voltage of the capacitor reaches a second voltage threshold, where the first threshold voltage is greater than the second threshold voltage. Additionally, the capacitor can be charged, which can be initiated when the voltage of the capacitor reaches the second threshold voltage. The charging of the capacitor can continue until the voltage of the capacitor reaches the first voltage threshold. Each time the capacitor discharges to the second voltage threshold, a count can be made. Each time the capacitor charges to the first voltage threshold, a count can be made. The counts can be used to provide an indication of a charge capacity of the battery. The indication can be displayed on a screen of an application in which the battery is used. Portable devices, such as but not limited to mobile telephones, may be arranged to provide the indication on a display of the portable device.

Figure 21:
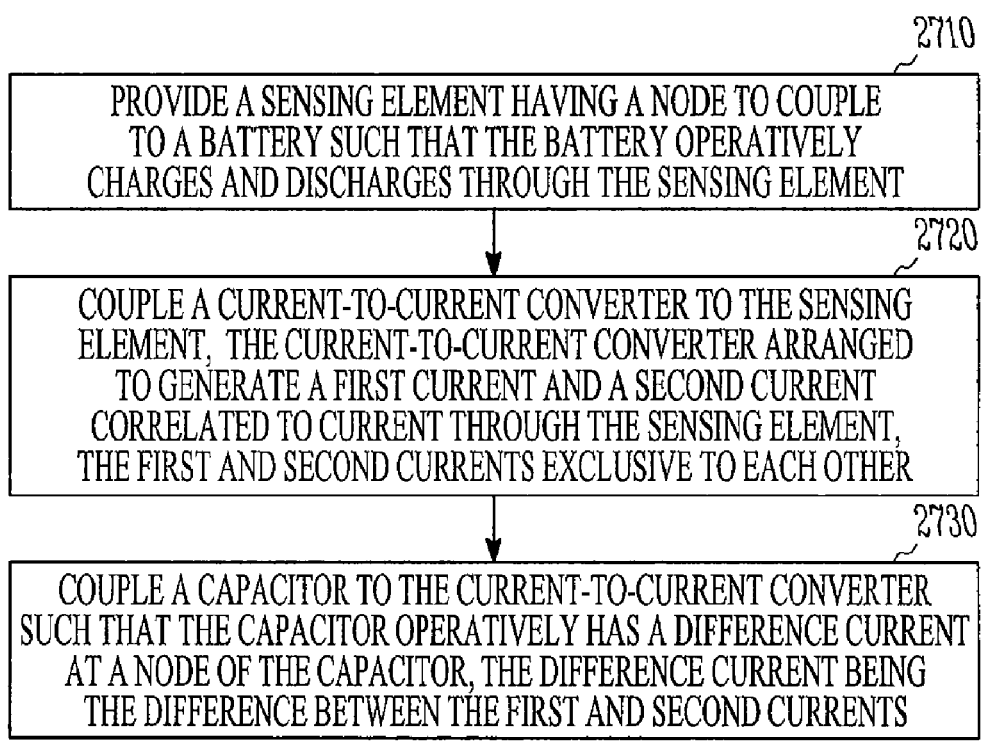
FIG. 21 shows features of a method of forming an arrangement that can be applied to battery gas gauges, according to various embodiments.

FIG. 21 shows features of a method of forming an arrangement that can be applied to battery gas gauges. At 2710, a sensing element is provided having a node to couple to a battery such that the battery operatively charges and discharges through the sensing element. The sensing element may be provided as a resistor. At 2720, a current-to-current converter is coupled to the sensing element, where the current-to-current converter is arranged to generate a first current and a second current such that the first current and the second current are correlated to current through the sensing element. The structure is arranged so that the first and second currents are exclusive to each other. Constructing the architecture can include forming the current-to-current converter having a current charging path and a current discharging path coupled to current mirrors configured to operatively generate the first and second currents exclusive to each other. At 2730, a capacitor is coupled to the current-to-current converter such that the capacitor operatively has at a difference current at a node of the capacitor, the difference current being the difference between the first and second currents.

In addition, a voltage comparator can be provided, where the voltage comparator is arranged to have a first voltage threshold and a second voltage threshold with the first voltage threshold being greater than the second voltage threshold. The voltage comparator can be coupled to the capacitor and to a switching circuit. The voltage comparator, the switching circuit, and the capacitor can be arranged such that the voltage comparator operatively controls the switching circuit to discharge the capacitor, initiated when the voltage of the capacitor reaches the first threshold voltage, until the voltage of the capacitor reaches the second voltage threshold. Further, the architecture can be constructed such that the voltage comparator operatively controls the switching circuit to charge the capacitor, initiated when the voltage of the capacitor reaches the second threshold voltage, until the voltage of the capacitor reaches the first voltage threshold. Forming the architecture can include coupling one or more counters to the capacitor, where the one or more counters are configured to count each time the capacitor charges to the first voltage threshold and to count each time the capacitor discharges to the second voltage threshold.

Various embodiments incorporating current to frequency converter based bidirectional battery fuel gauging or features thereof, as taught herein, can be implemented in a variety of different applications. These applications can include portable devices that use rechargeable batteries. The portable devices can include, but are not limited to, mobile telephones, portable computers such as laptop computers, personal digital assistants, handheld video game devices, cameras, medical devices, video players, audio players, multimedia devices, and portable information handling devices. Mobile telephones incorporating such battery fuel gauging are not limited to a particular type of mobile telephone but may include mobile telephones operating under various standards such as GSM, CDMA (Code division multiple access), TDMA (Time division multiple access), AMPS (Advanced Mobile Phone System) and others.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
   a sensing element through which a battery operatively charges and discharges;
   a current-to-current converter coupled to the sensing element to generate a first current and a second current, the two currents correlated to current flowing through the sensing element such that the first current is zero relative to a nonnegative reference current when the second current is non-zero relative to the nonnegative reference current and the second current is zero relative to the nonnegative reference current when the first current is non-zero relative to the nonnegative reference current; and
   a capacitor coupled to the current-to-current converter, the current-to-current converter operatively delivers a difference current at a node of the capacitor, the difference current being the difference between the first current and the second current.

2. The apparatus of claim 1, wherein the nonnegative reference current has a value equal to zero.

3. The apparatus of claim 1, further comprising:
   a switching circuit; and
   a voltage comparator coupled to the switching circuit, the voltage comparator having a first voltage threshold and a second voltage threshold, the first voltage threshold being greater than the second voltage threshold, the voltage comparator responsive to a voltage at the node of the capacitor such that the voltage comparator operatively controls the switching circuit to discharge the capacitor when the voltage reaches the first threshold voltage until the voltage of reaches the second voltage threshold.

4. The apparatus of claim 3, further comprising a counter configured to increment a count each time the capacitor discharges to the second voltage threshold and to increment another count each time charges to the first voltage threshold.

5. The apparatus of claim 1, wherein the sensing element includes a resistor.

6. The apparatus of claim 1, wherein the current to current converter comprises:
   a first transresistor coupled to a first node of the sensing element;
   first transconductor coupled to the first transresistor to generate the first current;
   a second transresistor coupled to a second node of the sensing element; and
   a second transconductor coupled to the second transresistor to generate the second current.

7. The apparatus of claim 1, further comprising a variable offset adder to provide a current offset to the current-to-current converter.

8. A method comprising:
generating a first current and a second current correlated to currents flowing through a sensing element through which a battery operatively charges and discharges, the first and two currents related to each other such that the first current is zero relative to a nonnegative reference current when the second current is non-zero relative to the nonnegative reference current and the second current is zero relative to the nonnegative reference current when the first current is non-zero relative to the nonnegative reference current; and
providing a difference current at a node of a capacitor, the difference current being the difference between the first current and the second current.

9. The method of claim 8, wherein the nonnegative reference current has a value equal to zero.

10. The method of claim 8, further comprising:
comparing a voltage of the capacitor to a threshold voltage; and
discharging the capacitor when the voltage of the capacitor reaches a first threshold voltage until the voltage of the capacitor reaches a second voltage threshold.

11. The method of claim 10, further comprising:
counting each time the capacitor discharges to the second voltage threshold; and
counting each time the capacitor charges to the first voltage threshold.

12. The method of claim 11, further comprising providing an indication of a charge capacity of the battery.

13. The method of claim 12, further comprising providing the indication on a display of a mobile telephone.

14. A method comprising:
providing a sensing element having a node to couple to a battery such that the battery operatively charges and discharges through the sensing element;
coupling a current-to-current converter to the sensing element, the current-to-current converter arranged to generate a first current and a second current correlated to current flowing through the sensing element, the current-to-current converter arranged such that the first current is zero relative to a nonnegative reference current when the second current is non-zero relative to the nonnegative reference current and the second current is zero relative to the nonnegative reference current when the first current is non-zero relative to the nonnegative reference current; and
coupling a capacitor to the current-to-current converter such that the capacitor operatively receives a difference current at a node of the capacitor, the difference current being the difference between the first and second currents.

15. The method of claim 14, wherein the nonnegative reference current has a value equal to zero.

16. The method of claim 14, further comprising:
providing a voltage comparator, the voltage comparator arranged to have a first voltage threshold and a second voltage threshold, the first voltage threshold being greater than the second voltage threshold,
coupling the voltage comparator to a switching circuit; and
coupling the voltage comparator to the capacitor, the voltage comparator, the switching circuit, and the capacitor arranged such that the voltage comparator operatively controls the switching circuit to discharge the capacitor when the voltage of the capacitor reaches the first threshold voltage until the voltage of the capacitor reaches the second voltage threshold.

17. The method of claim 14, further comprising coupling one or more counters to the capacitor, the one or more counters configured to count each time the capacitor charges to the first voltage threshold and to count each time the capacitor discharges to the second voltage threshold.

18. The method of claim 14, wherein providing the sensing element comprises providing a resistor as the sensing element.

19. The method of claim 14, further comprising forming the current-to-Current converter having a current charging path and a current discharging path coupled to current mirrors configured to operatively generate the first and second currents.

20. A system comprising:
a battery;
an application section having a power switching unit to operatively connect the battery to a charging source; and
a battery gauging unit coupled between the battery and the application section, the battery gauging unit including:
a sensing element through which the battery operatively charges and discharges;
a current-to-current converter coupled to the sensing element to generate a first current and to generate a second current, the two currents correlated to current flowing through the sensing element such that the first current is zero relative to a nonnegative reference current when the second current is non-zero relative to the nonnegative reference current and the second current is zero relative to the nonnegative reference current when the first current is non-zero relative to the nonnegative reference current; and
a capacitor coupled to the current-to-current converter, the current-to-current converter operatively delivers a difference current at a node of the capacitor, the difference current being the difference between the first current and the second current.

21. The system of claim 20, wherein the nonnegative reference current has a value equal to zero.

22. The system of claim 20, wherein the battery gauging unit further comprising:
a switching circuit; and
a voltage comparator coupled to the switching circuit, the voltage comparator having a first voltage threshold and a second voltage threshold, the first voltage threshold being greater than the second voltage threshold, the voltage comparator responsive to a voltage at the node such that the voltage comparator operatively controls the switching circuit to discharge the capacitor when the voltage reaches the first threshold voltage until the voltage reaches the second voltage threshold; and
a counter configured to increment a count each time the capacitor discharges to the second voltage threshold and to increment another count each time charges to the first voltage threshold.

23. The system of claim 20, wherein the current to current converter comprises:
a first transresistor coupled to a first node of the sensing element;
first transconductor coupled to the first transresistor to generate the first current;
a second transresistor coupled to a second node of the sensing element; and
a second transconductor coupled to the second transresistor to generate the second current.

24. The system of claim 20, wherein the system includes a mobile telephone.

* * * * *

UNITED STATES PATENT AND TRADEMARK OFFICE
CERTIFICATE OF CORRECTION

PATENT NO. : 8,183,834 B2
APPLICATION NO. : 12/361145
DATED : May 22, 2012
INVENTOR(S) : Haddani et al.

It is certified that error appears in the above-identified patent and that said Letters Patent is hereby corrected as shown below:

In the Drawings

Figure 4, at Numeral Identifier "475": delete "MULTIPLER" and insert --MULTIPLIER--.

In the Specification

Column 5, Line 36: delete "VH and VL" and insert --$V_H$ and $V_L$--.

Column 6, Line 32: delete "$\Phi_I$" and insert --$\Phi_1$--.

Column 8, Lines 9-10: delete "current to current" and insert --current-to-current--.

Column 9, Line 17: delete "VL" and insert --$V_L$--.

Column 9, Line 25: delete "VH" and insert --$V_H$--.

Column 9, Line 26: delete "VL" and insert --$V_L$--.

In the Claims

Column 12, Claim 3, Line 48: delete "voltage of" and insert --voltage--.

Column 12, Claim 6, Line 55: delete "current to current" and insert --current-to-current--.

Column 14, Claim 19, Line 10: delete "Current" and insert --current--.

Column 14, Claim 22, Line 54: delete "current to current" and insert --current-to-current--.

Signed and Sealed this
Twenty-fourth Day of December, 2013

Margaret A. Focarino
*Commissioner for Patents of the United States Patent and Trademark Office*